US006576401B2

(12) United States Patent
Teng

(10) Patent No.: US 6,576,401 B2
(45) Date of Patent: Jun. 10, 2003

(54) ON-PRESS DEVELOPABLE THERMOSENSITIVE LITHOGRAPHIC PLATES UTILIZING AN ONIUM OR BORATE SALT INITIATOR

(76) Inventor: Gary Ganghui Teng, 10 Kendall Dr., Nothborough, MA (US) 01532

(*) Notice: Subject to any disclaimer, the term of this patent is extended or adjusted under 35 U.S.C. 154(b) by 13 days.

(21) Appl. No.: 09/952,933

(22) Filed: Sep. 14, 2001

(65) Prior Publication Data

US 2003/0082475 A1 May 1, 2003

(51) Int. Cl.$^{7}$ .................................................. G03F 7/26

(52) U.S. Cl. .................... 430/303; 430/176; 430/273.1; 430/944; 430/945; 430/302

(58) Field of Search ................................ 430/944, 302, 430/303, 945, 273.1, 176

(56) References Cited

U.S. PATENT DOCUMENTS

| | | | | | |
|---|---|---|---|---|---|
| 4,273,851 | A | * | 6/1981 | Muzyczko et al. | 430/175 |
| 5,208,135 | A | * | 5/1993 | Patel et al. | 430/281.1 |
| 5,258,263 | A | | 11/1993 | Cheema et al. | 430/309 |
| 5,379,698 | A | | 1/1995 | Nowak et al. | 101/454 |
| 5,491,046 | A | | 2/1996 | DeBoer et al. | 430/302 |
| 5,516,620 | A | | 5/1996 | Cheng et al. | 430/138 |
| 5,616,449 | A | | 4/1997 | Cheng et al. | 430/302 |
| 5,674,658 | A | | 10/1997 | Burbery et al. | 430/262 |
| 5,677,106 | A | | 10/1997 | Burbery et al. | 430/253 |
| 5,677,110 | A | | 10/1997 | Chia et al. | 430/302 |
| 5,705,309 | A | | 1/1998 | West et al. | 430/167 |
| 5,807,659 | A | * | 9/1998 | Nishimiya et al. | 430/302 |
| 5,910,395 | A | * | 6/1999 | Li et al. | 430/302 |
| 5,955,238 | A | | 9/1999 | Yokoya et al. | 430/166 |
| 6,014,929 | A | | 1/2000 | Teng | 101/456 |
| 6,071,675 | A | | 6/2000 | Teng | 430/302 |
| 6,117,610 | A | | 9/2000 | Sheriff et al. | 430/190 |
| 6,153,356 | A | | 11/2000 | Urano et al. | 430/281.1 |
| 6,232,038 | B1 | | 5/2001 | Takasaki et al. | 430/281.1 |
| 6,242,156 | B1 | | 6/2001 | Teng | 430/271.1 |

FOREIGN PATENT DOCUMENTS

JP 2000-131837-a * 5/2000

OTHER PUBLICATIONS

"Plates for CTP," Seybold Report on Publishing Systems, vol. 24 No. 20, 1996.*

Hardley Sharples, "Thermal Plates Turn on the Heat," Graphic Arts Monthly, Jun. 1997.*

Hardley Sharples, "CTP Plates Ignite Imaging Systems War," Graphic Arts Monthly, May 1998.*

Lisa Cross, "No–Process Plates Lag CTP Curve," Graphic Arts Monthly, Feb. 1998.*

Kevin Juhasz, "Companies Putting Effort Behind Both CTP and Conventional," Plants and Platemaking, Jan. 1998.*

Mike Tartar, "Computer–To–Plate May Improve Environmental Impact," Newspapers and Technology, Jul. 1999.*

George Alexander, "Competing CTP Technologies Meet at Drupa," Newspapers and Technology, Mar. 2000.*

Clint Bolte, "Drupa 2000 Recap," Quick Printing. Sep. 2000.*

Mayu Mishina, "Hot Plates: Violet or Thermal No–Process," American Printinger, Jul 2001.*

Imation Press Release, "Imation Corp. Begins Operations as independent Company," Jul. 1, 1996, from Imation website: www.imation.com.*

Spectratech Press Release, "Spectratech International, Inc. Announces the Intended Purchase of the Imation Metal Plate Manufacturing Plant in Middleway, West Virginia," Dec. 4, 1998.*

Spectratech Press Release, "Spectratech Launches New Printing Plate Technology," Aug. 25, 1999, from Spectratech website: www.spectralitho.com.*

Spectratech Product Literature on Peerless KemFre (No–Process Plate), from Spectratech website: www.spectralitho.com. No date given.*

Spectra 830–n Literature (Conventional Thermal Plate), from Spectratech website: www.spectralitho.com. No date given.*

Spectratech Product List, from Spectratech website:www.spectralitho.com. No Date given.*

* cited by examiner

*Primary Examiner*—Cynthia Hamilton

(57) ABSTRACT

This patent describes an on-press developable thermosensitive lithographic plate having on a substrate a thermosensitive layer comprising an ethylenically unsaturated monomer, an infrared absorbing dye, and an onium or borate salt free radical initiator. The plate can be imagewise exposed with an infrared laser on a plate exposure device, and then mounted on a lithographic press for on-press development with ink and/or fountain solution and lithographic printing. No regular development process with a liquid developer is needed after exposure. Alternatively, the plate can be imagewise exposed with an infrared laser while mounted on a plate cylinder of a lithographic press, on-press developed with ink and/or fountain solution, and then print images to the receiving sheets.

30 Claims, No Drawings

ON-PRESS DEVELOPABLE THERMOSENSITIVE LITHOGRAPHIC PLATES UTILIZING AN ONIUM OR BORATE SALT INITIATOR

FIELD OF THE INVENTION

This invention relates to lithographic printing plates. More specifically, it relates to on-press developable thermosensitive lithographic plates comprising an onium or borate salt as free radical initiator in the thermosensitive layer.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

Lithographic printing can be further divided into two general types: wet lithographic printing (conventional lithographic printing) and waterless lithographic printing. In wet lithographic printing plates, the ink-receptive areas consist of oleophilic materials and the ink-repelling areas consist of hydrophilic materials; fountain solution (consisting of primarily water) is required to continuously dampen the hydrophilic materials during printing operation to make the non-image areas oleophobic (ink-repelling). In waterless lithographic printing plates, the ink-receptive areas consist of oleophilic materials and the ink-repelling areas consist of oleophobic materials; no dampening with fountain solution is required.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties (such as hydrophilic vs. oleophilic, and oleophobic vs. oleophilic). The photosensitive coating is usually a photosensitive material, which solubilizes or hardens upon exposure to an actinic radiation, optionally with further post-exposure overall treatment. Here, hardening means becoming insoluble in a certain developer. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial press operation and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,242,156.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate that is sensitized to a corresponding laser wavelength. This allows the elimination of the photomask film, reducing material, equipment and labor cost.

Among the laser imagable plates, infrared laser sensitive plates are the most attractive because they can be handled and processed under white light. Infrared laser sensitive plates are also called thermosensitive plates or thermal plates because the infrared laser is usually converted to heat to cause a certain chemical or physical change (such as hardening, solubilization, ablation, phase change, or thermal flow) needed for plate making (although in some systems certain electron or energy transfers from the infrared dye to the initiator may also take place).

Various thermosensitive plates have been disclosed in the patent literature. Examples of thermosensitive plates are described in U.S. Pat. Nos. 4,054,094 and 5,379,698 (laser ablation plates), U.S. Pat. Nos. 5,705,309, 5,674,658, 5,677,106, 6,153,356, 6,232,038, and 4,997,745 (negative thermosensitive plates), U.S. Pat. Nos. 5,491,046 and 6,117,610 (both positive and negative thermosensitive plates, depending on the process), and U.S. Pat. Nos. 5,919,600 and 5,955,238 (thermosensitive positive waterless plate).

Despite the progress in conventional on-press developable plates and digital laser imagable plates, there is a desire for a lithographic plate which can be imaged by thermal laser (infrared laser), does not produce ablation debris, and does not require a separate liquid development process. More specifically, there is a desire for a thermosensitive lithographic plate which is on-press developable with ink and/or fountain solution.

SUMMARY OF THE INVENTION

It is an object of this invention to provide a thermosensitive lithographic plate which is imagable with an infrared laser and on-press developable with ink and/or fountain solution.

It is another object of this invention to provide a thermosensitive lithographic plate comprising on a substrate a thermosensitive layer comprising an ethylenically unsaturated monomer, an infrared absorbing dye, and a free radical initiator selected from the group consisting of onium salt and borate salt.

It is yet another object of this invention to provide a method of on-press development or on-press imaging and development of the above lithographic plate.

Further objects, features and advantages of the present invention will become apparent from the detailed description of the preferred embodiments.

According to the present invention, there has been provided a method of lithographically printing images on a receiving medium, comprising in order:

(a) providing a lithographic plate comprising (i) a substrate; and (ii) a thermosensitive layer comprising a free radical polymerizable ethylenically unsaturated monomer (or oligomer) having at least one terminal ethylenic group, an infrared absorbing dye, and a free-radical initiator selected from the group consisting of onium salt and borate salt; wherein said thermosensitive layer is capable of hardening upon exposure to an infrared laser radiation, is soluble or dispersible in ink (for waterless plate) or in ink and/or fountain solution (for wet plate), and exhibits an affinity or aversion substantially opposite to the affinity or aversion of said substrate to at least one printing liquid selected from the group consisting of ink and an abhesive fluid for ink;

(b) imagewise exposing the plate with the infrared laser radiation to cause hardening of the thermosensitive layer in the exposed areas; and (c) contacting said exposed plate with ink and/or fountain solution on a lithographic press to remove the thermosensitive layer in the non-hardened areas, and to lithographically print images from said plate to the receiving medium.

The plate can be imagewise exposed with an infrared laser on a plate exposure device and then transferred to a lithographic press for on-press development with ink and/or fountain solution by rotating the plate cylinder and engaging ink and/or fountain solution roller. The developed plate can then directly print images to the receiving sheets (such as papers). Alternatively, the plate can be imagewise exposed with an infrared laser while mounted on a plate cylinder of a lithographic press, on-press developed on the same press cylinder with ink and/or fountain solution, and then directly print images to the receiving sheets.

The plate is usually coated on a manufacture line by coating the thermosensitive layer, and optionally the overcoat and/or the interlayer, on the substrate. The coated plate (which is usually cut to suitable sizes) is sold as commercial products to be used in the pressroom for imaging and printing. For direct-to-press applications, alternatively, the imaging member (including plate) may be directly coated on the plate cylinder of a lithographic press equipped with digital laser imaging device. The thermosensitive layer can be coated onto the substrate which is a sheet material mounted on the plate cylinder or is the surface of the plate cylinder of the press. The printing member coated on press can be imagewise exposed with an infrared laser, developed with ink and/or fountain solution, and then print imaging to the receiving medium.

The present invention also provides an on-press developable thermosensitive lithographic printing plate or printing member as described above.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support that has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the thermosensitive layer; commonly, a wet lithographic plate has a hydrophilic substrate and an oleophilic thermosensitive layer. For waterless plate, the substrate should have an oleophilic or oleophobic surface, depending on the surface properties of the thermosensitive layer (oleophobic or oleophilic).

Particularly preferred hydrophilic substrate for a wet lithographic plate is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer which is crosslinked, as described in U.S. Pat. No. 5,922,502.

For preparing a plate having a thermosensitive layer conformally coated on a roughened substrate as described in U.S. Pat. No. 6,242,156, the substrate should have roughened surface. Here the roughened surface is defined as a surface having microscopic, non-smooth structures on the whole surface (for the roughened side). Such microscopic structures include regular or irregular peaks, valleys, pores, and holes. Such a support may be a metal sheet, a polymer film, or a coated paper. Mechanically, chemically or electrochemically grained and anodized aluminum substrates are preferred metal substrates.

The thermosensitive layer of the current invention comprises a free radical polymerizable ethylenically unsaturated monomer (or oligomer) having at least one terminal ethylenic group, an infrared absorbing dye, and a free-radical initiator selected from the group consisting of onium salt and borate salt; wherein said thermosensitive layer is capable of hardening upon exposure to an infrared laser radiation, is soluble or dispersible in ink (for waterless plate) or in ink and/or fountain solution (for wet plate), and exhibits an affinity or aversion substantially opposite to the affinity or aversion of said substrate to at least one printing liquid selected from the group consisting of ink and an abhesive fluid for ink. The thermosensitive layer preferably has a coverage of from 100 to 4000 $mg/m^2$, and more preferably from 300 to 2000 $mg/m^2$.

It is noted that the thermosensitive layer can be a single layer with substantially homogeneous composition along the depth. However, the thermosensitive layer can consist of more than one sublayers having different compositions (such as different resins) or different material ratios in each layer (such as higher infrared dye amount in the inner layer than the top layer). The thermosensitive layer may also have composition gradient along the depth (such as lower infrared dye amount toward the surface and higher infrared dye amount toward the substrate).

Various additives useful for conventional photosensitive layer can also be used, including pigment, dye, exposure indicator, surfactant, and stabilizer.

One or more polymeric binders may be added into the thermosensitive formulation. The, polymers may or may not have ethylenic functional groups. Suitable polymeric binders for the thermosensitive layers of this invention include, for example, polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, butadiene/acrylonitrile copolymer, and aqueous alkaline soluble polymer (such as acrylic polymers with substantial number of carboxylic acid functional groups, polymers with substantial number of phenol groups, and polymers with acrylic and acidic functional groups as described in U.S. Pat. No. 5,849,462). For oleophilic thermosensitive layers, preferred polymeric binders are aqueous alkaline-insoluble oleophilic polymers.

Suitable free-radical polymerizable monomers (including oligomers) include, for example, multifunctional acrylate monomers or oligomers (such as acrylate and methacrylate esters of ethylene glycol, trimethylolpropane, pentaerythritol, ethoxylated ethylene glycol and ethoxylated trimethylolpropane, multifunctional urethanated acrylate and methacrylate, and epoxylated acrylate or methacrylate), and oligomeric amine diacrylates. The acrylic monomers may also have other double bond or epoxide group, in addition to acrylate or methacrylate group. The acrylic monomers may also contain an acidic (such as carboxylic acid) or basic (such as amine) functionality. It is noted that the terms monomer and oligomer are used exchangeably in this patent; the term monomer includes both monomer and oligomer. The term acrylate includes both acrylate and methacrylate.

Various onium salts and borate salts can be used for the free-radical initiator of this invention. Such an onium salt or borate salt must be capable of generating free radical at elevated temperature and/or through energy or charge transfer from an infrared absorbing dye upon irradiation of an infrared laser in the presence of an infrared dye. The onium or borate salt is preferably added in the thermosensitive layer at 0.1 to 30% by weight, more preferably at 1 to 20%.

Suitable onium salts include, for example, diazonium salts (such as aryldiazonium hexafluoroantimonate), iodonium salts (such as diaryliodonium hexafluoroantimonate and diaryliodonium triflate), sulfonium salts (such as triarylsulfonium hexafluorophosphate and triarylsulfonium p-toluenesulfonate), phosphonium salts (such as (3-phenylpropan-2-onyl) triaryl phosphonium hexafluoroantimonate), and pyridinium salts (such as N-ethoxy(2-methyl)pyridinium hexafluorophosphate). Examples of suitable onium salts are also described in U.S. Pat. Nos. 5,955,238, 6,037,098, and 5,629,354, and "Handbook of Radical Vinyl Polymerization" edited by Mishra, et al (Marcel Dekker, New York, 1998), Chapter 7, pages 178–179. Diaryliodonium salts and triarylsulfonium salts are preferred onium salts.

Suitable borate salts include, for example, triarylalkylborate salts and tetraarylborate salts. Examples of suitable borate salts include tetrabutylammonium triphenyl(n-butyl) borate, tetraethylammonium triphenyl(n-butyl)borate, tetrabutylammonium tri(4-methylphenyl)(n-butyl)borate, diphenyliodonium triphenyl(n-butyl)borate, di(4-(t-butyl) phenyl)iodonium triphenyl(n-butyl)borate, diphenyliodonium tetraphenylborate, triethylallylammonium triphenyl(n-butyl)borate, triphenylallylphosphonium triphenyl(n-butyl) borate, N-ethoxy(2-methyl)pyridinium triphenyl(n-butyl) borate, N-methyl(2-chloro)pyridinium triphenyl(n-butyl) borate, and triphenylsulfonium triphenyl(n-butyl)borate. Various borate salts are described in U.S. Pat. Nos. 6,232,038 and 6,218,076, and can be used as the free radical initiator of this invention. Triarylalkylborate salts are preferred borate salts.

For onium salts or borate salts with one or more aryl groups, the aryl group can be a phenyl or any aromatic ring (including heteroaromatic ring) with or without one or more substitutes. The substitutes may, for example, be an alkyl group, an alkoxy group, an alkoxyalkoxy group, an alkoxyalkyl group, a polyether group, a carboxy group, an acyloxy group, an alkoxycarbonyl group, a hydroxyl group, an amino group, an alkylamino group, a halogenated alkyl group or a halogen atom. Aryl groups with such substitutes usually provide improved solubility or compatibility of the onium or borate salts over aryl groups without such substitutes. Examples of diaryliodonium salt with a substitute on the phenyl group include (4-(2-Hydroxytetradecyl-oxy)-phenyl) phenyliodonium hexafluoroantimonate and di(4-t-butylphenyl)iodonium camphorsulfonate. Examples of triarylsulfonium salt with a substitute on the phenyl group include tri(4-t-butylphenyl)sulfonium 4-toluenesulfonate. Examples of triarylalkylborate salt with a substitute on the phenyl group include tetrabutylammonium tri(4-ethylphenyl)(n-butyl)borate.

Infrared absorbing dyes useful for the thermosensitive layer of this invention include any infrared light absorbing dyes (also called infrared dyes) effectively absorbing an infrared radiation having a wavelength of 700 to 1,500 nm. It is preferable that the infrared dye has an absorption maximum between 750 and 1,200 nm. Various infrared absorbing dyes are described in U.S. Pat. Nos. 5,858,604, 5,922,502, 6,022,668, 5,705,309, 6,017,677, 5,677,106, 6,153,356, and 6,232,038, and in the book entitled "Infrared Absorbing Dyes" edited by Masaru Matsuoka, Plenum Press, New York (1990), and can be used as the infrared absorbing dye for the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. The infrared dye is added in the thermosensitive layer preferably at 0.01 to 30% by weight of the thermosensitive layer, and more preferably at 0.1 to 10%.

Various surfactants may be added into the thermosensitive layer to allow or enhance the on-press ink and/or fountain solution developability. Both polymeric and small molecule surfactants can be used. However, it is preferred that the surfactant has low or no volatility so that it will not evaporate from the thermosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g thermosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol; ethoxylated or propoxylated acrylate oligomers; and polyethoxylated alkylphenols and polyethoxylated fatty alcohols. The nonionic surfactant is preferably added at from 0.01 to 30% by weight of the thermosensitive layer, more preferably from 0.3 to 20%, and most preferably from 1 to 15%.

In a preferred embodiment as for thermosensitive lithographic printing plates of this invention, the thermosensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one free-radical initiator selected from the group consisting of onium salt and borate salt, and at least one infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added.

The free radical initiator (onium salt or borate salt) used in the thermosensitive layer can be sensitive to ultraviolet light (or even visible light), or can be only sensitive to light of shorter wavelength, such as shorter than 350 nm. Thermosensitive layer containing ultraviolet light (or visible light) sensitive initiator will also allow actinic exposure with ultraviolet light (or visible light). Thermosensitive layer containing initiator only sensitive to shorter wavelength (such as shorter than 350 nm) will have good white light stability. Each type of initiator has its own advantage, and can be used to design a specific product. In this patent, all types of free radical initiators can be used.

It is noted that the free radical initiator (onium or borate salt) in the presence of an infrared absorbing dye may form free radicals through, for example, electron or energy transfer from the infrared dye or thermal decomposition, upon exposure to an infrared radiation. In this patent, any initiating system comprising an onium or borate salt and an infrared absorbing dye capable of generating free radical upon exposure to an infrared radiation can be used for the thermosensitive layer of this invention, irrespective of the free radical generating mechanism.

The on-press developable thermosensitive layers described in U.S. Ser. Nos. 09/656,052 now U.S. Pat. No. 6,482,571 B1 and Ser. No. 09/873,598 can be used for the thermosensitive layer of the current invention, the entire disclosure of which is hereby incorporated by reference.

The thermosensitive layer may be conformally coated onto a roughened substrate (for example, with Ra of larger than 0.4 micrometers) at thin coverage (for example, of less than 1.5 $g/m^2$) so that the plate can have microscopic peaks and valleys on the thermosensitive layer coated surface and exhibit low tackiness and good block resistance, as described in U.S. Pat. No. 6,242,156, the entire disclosure of which is hereby incorporated by reference.

An ink and/or fountain solution soluble or dispersible protective overcoat may be deposited on top of the thermosensitive layer to, for example, protect the thermosensitive layer from oxygen inhibition, contamination, and/or physical damage during handling, reduce tackiness and blocking tendency, and/or improve the on-press developability. For wet plate, the overcoat preferably comprises a water-soluble polymer, such as polyvinyl alcohol (including various water-soluble derivatives of polyvinyl alcohol). Various additives, such as surfactant, wetting agent, defoamer, leveling agent, and dispersing agent, can be added into the overcoat formulation to facilitate, for example, the coating or development process. Various nonionic surfactants and ionic surfactants can be used. Examples of surfactants useful in the overcoat of this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added preferably at 0.01 to 40% by weight of the overcoat, more preferably at 0.2 to 15%. The overcoat preferably has a coverage of from 0.001 to 2 $g/m^2$, more preferably from 0.002 to 1 $g/m^2$, most preferably from 0.005 to 0.5 $g/m^2$.

For plates with rough and/or porous surface capable of mechanical interlocking with a coating deposited thereon, a thin releasable interlayer soluble or dispersible in ink (for waterless plate) or ink and/or fountain solution (for wet plate) may be deposited between the substrate and the thermosensitive layer. Here the substrate surface is rough and/or porous enough and the interlayer is thin enough to allow bonding between the thermosensitive layer and the substrate through mechanical interlocking. Such a plate configuration is described in U.S. Pat. No. 6,014,929, the entire disclosure of which is hereby incorporated by reference.

The plate is usually coated on a manufacture line by coating the thermosensitive layer, and optionally the overcoat and/or the interlayer, on the substrate. The coated plate (which is usually cut to suitable sizes) is sold as commercial products to be used in the pressroom for imaging and printing. For direct-to-press applications, alternatively, the plate may be directly coated on the plate cylinder of a lithographic press equipped with digital laser imaging device. The thermosensitive layer can be coated onto the substrate which is a sheet material mounted on the plate cylinder or is the surface of the plate cylinder of the press. A coating device containing the thermosensitive fluid can be mounted on the press. The coating device can coat through any means, such as slot coating, roller coating, spray coating, and inkjet. The coating fluid can be a solvent or aqueous solution or dispersion, or can be free of solvent or water. For coating free of solvent or water, a liquid or semisolid thermosensitive coating material is used. After coating (and optionally further drying), the thermosensitive layer can be exposed with an infrared laser to imagewise harden the exposed areas. The exposed plate surface can then be contacted with ink and/or fountain solution to remove the non-exposed areas and to print imaging from the plate (usually through a blanket cylinder) to the receiving medium. The plate substrate can be a sheet material mounted on the plate cylinder, or can be the cylinder surface. For press using the cylinder surface as the substrate or with a reusable plate substrate, after the completion of printing, the hardened thermosensitive layer may be stripped off by various means, including wiping with a cloth dampened with a solvent or solution or stripping with a blade. Such a stripping process may be performed by hand or with a stripping device mounted on the press.

Infrared lasers useful for the imagewise exposure of the thermosensitive plates of this invention include laser sources emitting in the near infrared region, i.e. emitting in the wavelength range of from 700 to 1500 nm, and preferably from 750 to 1200 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 2000 $mJ/cm^2$, more preferably from 5 to 1000 $mJ/cm^2$, most preferably from 30 to 500 $mJ/cm^2$, depending on the sensitivity of the thermosensitive layer.

Laser imaging devices are currently widely available commercially. Any device can be used which provides imagewise laser exposure according to digital imaging information. Commonly used imaging devices include flatbed imager, internal drum imager, and external drum imager. Internal drum imager and external drum imager are preferred imaging devices.

The plate can be imaged off press or on press. For off-press imaging, the plate is imagewise exposed with a laser in a plate imaging device, and the exposed plate is then mounted on the plate cylinder of a lithographic press to be developed with ink (for waterless plate) or with ink and/or fountain solution (for wet plate) by rotating the press cylinders and contacting the plate with ink and/or fountain solution and to lithographically print images from said plate to the receiving media (such as papers). For on-press imaging, the plate is exposed while mounted on a lithographic printing press cylinder, and the exposed plate is directly developed on press with ink and/or fountain solution during initial press operation and then prints out regular printed sheets. This is especially suitable for computer-to-press application in which the plate (or plates, for multiple color press) is directly exposed on the plate cylinder of a press according to computer generated digital imaging information and, with minimum or no treatment, directly prints out regular printed sheets. For on-press development, good quality prints should be obtained preferably under 20 initial impressions, and more preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink by Flink Ink Company, which can be used for printing wet lithographic plate without the use of fountain solution, can also be used for the on-press development and printing of the plate of this invention.

The plate may be rinsed or applied with an aqueous solution, including water and fountain solution, to remove the water-soluble or dispersible overcoat (for plate with an overcoat) and/or to dampen without developing the plate, after imagewise exposure and before on-press development with ink and/or fountain solution.

A liquid layer may be applied onto the surface of the plate (with or without an overcoat) before and/or during imaging process to provide an in situ oxygen barrier layer during the imaging process to allow faster photospeed and better curing. The liquid layer can be any liquid material that does not cause substantial adverse effect on the plate. Water, fountain solution, and other aqueous solutions are preferred materials for forming the liquid layer for a plate with an oleophilic thermosensitive layer. The liquid layer may be applied from a dampening roller of a lithographic press with the plate being mounted on the plate cylinder during on-press imaging process. The dampening roller can be a regular dampening roller which supplies fountain solution during printing or can be a different roller.

An inert gas (such as nitrogen) may be introduced within the device or near the exposure areas during a laser imaging process to reduce inhibition of free radical polymerization of the thermosensitive layer by oxygen. The inert gas may be flushed from a nozzle mounted next to the laser head onto the areas being imaged during the laser imaging process; this is especially useful for external drum imaging devices, including off-press laser imaging devices having an external drum and on-press laser imaging devices utilizing plate cylinder as the imaging drum.

This invention is further illustrated by the following non-limiting examples of its practice. Unless specified, all the values are by weight.

EXAMPLE 1

An electrochemically grained, anodized, and silicate treated aluminum substrate (with an Ra of about 0.5 microns) was coated using a #6 Meyer rod with a thermosensitive layer formulation TS-1, followed by drying in an oven at 80° C. for 5 min.

TS-1

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 0.50 |
| PINA FK-1026 (Infrared absorbing polymethine dye from Allied Signal) | 0.20 |
| Acetone | 90.2 |

The above plate was exposed with an infrared laser plate imager equipped with laser diodes emitting at about 830 nm (Pearlsetter™, from Presstek). The plate was mounted on the imaging drum (external drum) and exposed at a laser dosage of about 600 $mJ/cm^2$. The exposed areas were bleached from the original slightly green color of the plate.

The plate was tested on a wet lithographic press (AB Dick 360) equipped with integrated inking/dampening system. The exposed plate was directly mounted on the plate cylinder of the press. The press was started for 10 rotations, and the ink roller (carrying emulsion of ink and fountain solution) was then applied to the plate cylinder to rotate until the plate showed clean background. The plate cylinder was then engaged with the blanket cylinder and printed with papers. The printed sheets showed clean background and good inking under 10 impressions. The press continued to run for a total of 100 impressions without showing any wearing (The press stopped at 100 impressions.).

EXAMPLE 2

The plate prepared in EXAMPLE 1 was further coated with a water-soluble overcoat OC-1 using a #6 Meyer rod, followed by drying in an oven at 80° C. for 5 min.

OC-1

| Component | Weight ratios |
|---|---|
| Airvol 205 (Polyvinyl alcohol from Air Products and Chemicals Company) | 2.00 |
| Zonyl FSO (Perfluorinated surfactant from DuPont) | 0.02 |
| Water | 98.00 |

The overcoated plate was exposed and on-press developed as in EXAMPLE 1. The printed sheets showed clean background and good inking under 5 impressions. The plate continued to run for a total of 100 impressions without showing any wearing (The press stopped at 100 sheets.).

EXAMPLE 3

In this example, the plate is the same as in EXAMPLE 1 except that a thin releasable interlayer (a water-soluble polymer) is interposed between the substrate and the thermosensitive layer.

An electrochemically roughened, anodized, and silicate treated aluminum sheet was first coated with a 0.2% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-1 with a #6 Meyer rod, followed by drying in an oven at 80° C. for 5 min.

The plate was exposed and on-press developed as in EXAMPLE 1. The printed sheets showed clean background and good inking under 2 impressions. The plate continued to run for a total of 100 impressions without showing any wearing (The press stopped at 100 sheets.).

EXAMPLE 4

An electrochemically roughened, anodized, and silicate treated aluminum sheet was coated using a #6 Meyer rod with a thermosensitive layer formulation TS-2, followed by drying in an oven at 80° C. for 5 min.

TS-2

| Component | Weight ratios |
|---|---|
| Neocryl B-728 (Polymer from Zeneca) | 2.776 |
| Sartomer SR-399 (Acrylic monomer from Sartomer) | 6.635 |
| Pluronic L43 (Nonionic surfactant from BASF) | 0.565 |
| Irganox 1035 (Antioxidant from Ciba-Geigy) | 0.012 |
| 2,6-Di-tert-butyl-4-methylphenol | 0.012 |
| Irgacure 369 (Initiator from Ciba-Geigy) | 0.50 |
| (4-(2-Hydroxytetradecyl-oxy)-phenyl)phenyliodonium hexafluoroantimonate | 0.70 |
| PINA FK-1026 (Infrared absorbing polymethine dye from Allied Signal) | 0.50 |
| Acetone | 90.000 |

The plate was exposed with an infrared laser plate imager equipped with laser diodes emitting at about 830 nm (Trendsetter™, from CreoScitex). The plate was mounted on the imaging drum (external drum) and exposed at a laser dosage of about 400 mJ/cm$^2$.

The plate was on-press developed as in EXAMPLE 1. The printed sheets showed clean background and good inking under 5 impressions. The plate continued to run for a total of 100 impressions without showing any wearing (The press stopped at 100 sheets.).

EXAMPLE 5

An electrochemically roughened, anodized, and polyvinylphosphonic acid treated aluminum sheet was coated using a #6 Meyer rod with a thermosensitive layer formulation TS-3, followed by drying in an oven at 80° C. for 5 min.

TS-3

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| ADS-830AT (Infrared absorbing cyanine dye from American Dye Source, Montreal) | 0.20 |
| Acetone | 90.2 |

The thermosensitive layer coated plate was further coated with a water-soluble overcoat OC-2 using a #6 Meyer rod, followed by drying in an oven at 80° C. for 5 min.

OC-2

| Component | Weight ratios |
|---|---|
| Airvol 205 (Polyvinyl alcohol from Air Products and Chemicals Company) | 0.2 |
| Dioctyl sulfosuccinate sodium salt (surfactant) | 0.01 |
| Water | 99.8 |

The plate was exposed with an infrared laser plate imager equipped with laser diodes emitting at about 830 nm (Dimension 400, from Presstek). The plate was mounted on the imaging drum (external drum) and exposed at a laser dosage of about 300 mJ/cm$^2$. The exposed areas showed yellow-brown imaging pattern, in contrast to the light green non-imaged areas.

The plate was on-press developed as in EXAMPLE 1. The printed sheets showed clean background and good inking under 10 impressions. The plate continued to run for a total of 500 impressions without showing any wearing (The press stopped at 500 sheets.).

EXAMPLE 6

In this example, the plate is the same as in EXAMPLE 5 except that a thin releasable interlayer (a water-soluble polymer) is interposed between the substrate and the thermosensitive layer.

An electrochemically roughened, anodized, and polyvinyl phosphonic acid treated aluminum sheet was first coated with a 0.1% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-3 with a #6 Meyer rod, followed by drying in an oven at 80° C. for 5 min.

The plate was exposed and on-press developed as in EXAMPLE 5. The printed sheets showed clean background and good inking under 2 impressions. The plate continued to run for a total of 500 impressions without showing any wearing (The press stopped at 500 sheets.).

EXAMPLE 7

An electrochemically roughened, anodized, and silicate treated aluminum sheet was first coated with a 0.1% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-4 with a #6 Meyer rod, followed by drying in an oven at 80° C. for 5 min.

TS-4

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| Cyracure 6974 (Mixed triarylsulfonium hexafluoroantimonate from Union Carbide) | 1.00 |
| PINA FK-1026 (Infrared absorbing polymethine dye from Allied Signal) | 0.20 |
| Acetone | 90.2 |

The thermosensitive layer coated plate was further coated with a water-soluble overcoat OC-2 using a #6 Meyer rod, followed by drying in an oven at 80° C. for 5 min.

The plate was exposed with an infrared laser plate imager equipped with laser diodes emitting at about 830 nm (Dimension 400, from Presstek). The plate was mounted on the imaging drum and exposed at a laser dosage of about 450 $mJ/cm^2$.

The exposed plate was on-press developed as in EXAMPLE 1. The printed sheets showed clean background and good inking under 2 impressions. The plate continued to run for a total of 200 impressions without showing any wearing (The press stopped at 200 sheets.).

EXAMPLE 8

An electrochemically roughened, anodized, and silicate treated aluminum sheet was first coated with a 0.1% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-5 with a #6 Meyer rod, followed by drying in an oven at 80° C. for 5 min.

TS-5

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| Diphenyliodonium tetraphenylborate | 1.00 |
| ADS-830AT (Infrared absorbing cyanine dye from American Dye Source, Montreal) | 0.20 |
| Acetone | 90.2 |

The thermosensitive layer coated plate was further coated with a water-soluble overcoat OC-3 using a #6 Meyer rod, followed by drying in an oven at 80° C. for 5 min.

OC-3

| Component | Weight ratios |
|---|---|
| Airvol 205 (Polyvinyl alcohol from Air Products and Chemicals Company) | 2.00 |
| Dioctyl sulfosuccinate sodium salt (surfactant) | 0.08 |
| Water | 98.0 |

The plate was exposed with an infrared laser plate imager equipped with laser diodes emitting at about 830 nm (Dimension 400, from Presstek). The plate was mounted on the imaging drum and exposed at a laser dosage of about 300 $mJ/cm^2$.

The exposed plate was on-press developed as in EXAMPLE 1. The printed sheets showed clean background and good inking under 2 impressions. The plate continued to run for a total of 200 impressions without showing any wearing (The press stopped at 200 sheets.).

EXAMPLE 9

An electrochemically roughened, anodized, and silicate treated aluminum sheet was first coated with a 0.1% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-6 with a #6 Meyer rod, followed by drying in an oven at 80° C. for 5 min.

TS-6

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 0.70 |
| 2,4-Bis(trichloromethyl)-6-(ethoxy-2-ethoxy)-s-triazine | 0.30 |
| ADS-830AT (Infrared absorbing cyanine dye from American Dye Source, Montreal) | 0.10 |
| Acetone | 90.2 |

The thermosensitive layer coated plate was further coated with a water-soluble overcoat OC-3 using a #6 Meyer rod, followed by drying in an oven at 80° C. for 5 min.

The plate was exposed with an infrared laser plate imager equipped with laser diodes emitting at about 830 nm (Dimension 400, from Presstek). The plate was mounted on the imaging drum and exposed at a laser dosage of about 300 $mJ/cm^2$. The exposed areas showed yellow-brown imaging pattern, in contrast to the light green non-imaged areas.

The exposed plate was on-press developed as in EXAMPLE 1. The printed sheets showed clean background and good inking under 2 impressions. The plate continued to run for a total of 200 impressions without showing any wearing (The press stopped at 200 sheets.).

EXAMPLE 10

An electrochemically roughened, anodized, and silicate treated aluminum sheet was first coated with a 0.1% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-7 with a #6 Meyer rod, followed by drying in an oven at 80° C. for 5 min.

TS-7

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| ADS-830AT (Infrared absorbing cyanine dye from American Dye Source, Montreal) | 0.02 |
| Acetone | 90.2 |

The thermosensitive layer coated plate was further coated with a water-soluble overcoat OC-3 using a #6 Meyer rod, followed by drying in an oven at 80° C. for 5 min.

The plate was exposed with an infrared laser plate imager equipped with laser diodes emitting at about 830 nm (Dimension 400, from Presstek). The plate was mounted on the imaging drum and exposed at a laser dosage of about 300 $mJ/cm^2$.

The exposed plate was on-press developed as in EXAMPLE 1. The printed sheets showed clean background and good inking under 2 impressions. The plate continued to run for a total of 200 impressions without showing any wearing (The press stopped at 200 sheets.).

EXAMPLE 11

An electrochemically roughened, anodized, and silicate treated aluminum sheet was first coated with a 0.1% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation TS-8 with a #6 Meyer rod, followed by drying in an oven at 80° C. for 5 min.

TS-8

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| ADS-830AT (Infrared absorbing cyanine dye from American Dye Source, Montreal) | 0.30 |
| Acetone | 90.2 |

The thermosensitive layer coated plate was further coated with a water-soluble overcoat OC-4 using a #6 Meyer rod, followed by drying in an oven at 80° C. for 5 min.

OC-4

| Component | Weight ratios |
|---|---|
| Airvol 205 (Polyvinyl alcohol from Air Products and Chemicals Company) | 5.00 |
| Silwet 7604 (surfactant, from Union Carbide) | 0.05 |
| Water | 95.0 |

The plate was exposed with an infrared laser plate imager equipped with laser diodes emitting at about 830 nm (Trendsetter™, from CreoScitex). The plate was mounted on the imaging drum and exposed at a laser dosage of about 200 $mJ/cm^2$.

The plate was tested on a wet lithographic press (Multigraphics 1250) equipped with conventional inking and dampening systems. The exposed plate was directly mounted on the plate cylinder of the press. After starting the press, the plate cylinder was contacted with the fountain solution roller for 10 rotations and then with the ink roller for 10 rotations. The plate cylinder was then engaged with the blanket cylinder and printed with papers. The printed sheets showed clean background and good inking under 2 impressions. The press continued to run for a total of 200 impressions without showing any wearing (The press stopped at 200 impressions.).

I claim:

1. A method of lithographically printing images on a receiving medium, comprising in order:

(a) providing a lithographic plate comprising (i) a substrate; and (ii) a thermosensitive layer comprising a free radical polymerizable ethylenically unsaturated monomer having at least one terminal ethylenic group, an infrared absorbing dye, and a free-radical initiator selected from the group consisting of onium salt and borate salt; wherein said thermosensitive layer is capable of hardening upon exposure to an infrared laser radiation, is soluble or dispersible in and on-press developable with ink (for waterless plate) or ink and/or fountain solution (for wet plate), and exhibits an affinity or aversion substantially opposite to the affinity or aversion of said substrate to at least one printing liquid selected from the group consisting of ink and an abhesive fluid for ink;

(b) imagewise exposing the plate with the infrared laser radiation according to digital imaging information to cause hardening of the thermosensitive layer in the exposed areas; and (c) contacting said exposed plate with ink and/or fountain solution on a lithographic press to remove the thermosensitive layer in the non-hardened areas, and to lithographically print images from said plate to the receiving medium.

2. The method of claim 1 wherein said free-radical initiator is an onium salt selected from the group consisting of diazonium salt, iodonium salt, sulfonium salt, phosphonium salt, and pyridinium salt.

3. The method of claim 1 wherein said free-radical initiator is a diaryliodonium salt.

4. The method of claim 1 wherein said free-radical initiator is a triarylsulfonium salt.

5. The method of claim 1 wherein said free-radical initiator is a triarylalkylborate salt or tetraarylborate salt.

6. The method of claim 1 wherein said infrared absorbing dye is a cyanine dye or phthalocyanine dye.

7. The method of claim 1 wherein said thermosensitive layer further comprises a polymeric binder.

8. The method of claim 1 wherein said plate further includes a releasable interlayer interposed between the substrate and the thermosensitive layer, said releasable interlayer being soluble or dispersible in ink (for waterless plate) or in ink and/or fountain solution (for wet plate); wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

9. The method of claim 1 wherein said substrate has a roughened surface comprising peaks and valleys, and said thermosensitive layer is substantially conformally coated on the roughened substrate surface so that the surface of said thermosensitive layer has peaks and valleys substantially corresponding to the major peaks and valleys of the substrate microscopic surface; and said substrate has an average surface roughness Ra of about 0.2 to about 2.0 microns, said thermosensitive layer has an average coverage of about 0.1 to about 2.0 $g/m^2$, and the average height of the valleys on the thermosensitive layer surface is at least 0.1 microns below the average height of the peaks of the substrate surface.

10. The method of claim 1 wherein said substrate is oleophilic and said thermosensitive layer is oleophobic, and said plate is a waterless plate.

11. The method of claim 1 wherein said substrate is hydrophilic and said thermosensitive layer is oleophilic, and said plate is a wet plate.

12. The method of claim 11 wherein said thermosensitive layer further comprises a nonionic surfactant at 0.3 to 20% by weight of the thermosensitive layer.

13. The method of claim 1 wherein said substrate is hydrophilic; and said thermosensitive layer is oleophilic and comprises a polymeric binder, an acrylate or methacrylate monomer, an infrared absorbing dye, and a free-radical initiator selected from the group consisting of diaryliodonium salt, triarylsulfonium salt, triarylalkylborate salt, and tetraarylborate salt.

14. The method of claim 1 wherein said plate further includes a top ink and/or fountain solution soluble or dispersible top layer on the thermosensitive layer.

15. The method of claim 1 wherein said plate is a wet plate and further includes a top water soluble polymer layer on the thermosensitive layer.

16. The method of claim 1 wherein said plate is exposed on an imaging device off the press and then mounted onto a plate cylinder of a lithographic press for on-press development with ink and/or fountain solution, and lithographic printing.

17. The method of claim 1 wherein said plate is mounted on a plate cylinder of a lithographic press for the imagewise infrared laser exposure, on-press development with ink and/or fountain solution, and lithographic printing.

18. A method of lithographically printing images on a receiving medium, comprising in order:

(a) providing on a lithographic press a lithographic printing member comprising (i) a substrate; and (ii) a thermosensitive layer comprising a free radical polymerizable ethylenically unsaturated monomer having at least one terminal ethylenic group, an infrared absorbing dye, and a free-radical initiator selected from the group consisting of onium salt and borate salt; wherein said substrate is a sheet material mounted on a plate cylinder or is the surface of a plate cylinder of the lithographic press; and said thermosensitive layer is capable of hardening upon exposure to an infrared laser radiation, is soluble or dispersible in and on-press developable with ink (for waterless plate) or ink and/or fountain solution (for wet plate), and exhibits an affinity or aversion substantially opposite to the affinity or aversion of said substrate to at least one printing liquid selected from the group consisting of ink and an abhesive fluid for ink;

(b) imagewise exposing the plate with the infrared laser radiation according to digital imaging information to cause hardening of the thermosensitive layer in the exposed areas; and (c) operating said press to contact said exposed plate with ink and/or fountain solution to remove the thermosensitive layer in the non-hardened areas, and to lithographically print images from said plate to the receiving medium.

19. The method of claim 18 wherein said printing member is prepared by coating the thermosensitive layer onto the substrate on the lithographic press, said substrate being the surface of a plate cylinder of the lithographic press.

20. The method of claim 18 wherein said printing member is prepared by coating the thermosensitive layer onto the substrate on the lithographic press, said substrate being a sheet material mounted on a plate cylinder.

21. The method of claim 18 wherein said printing member is a lithographic plate that is coated before being mounted onto the plate cylinder of the lithographic press.

22. The method of claim 18 wherein said substrate is hydrophilic; and said thermosensitive layer is oleophilic and comprises a polymeric binder, an acrylate or methacrylate monomer, an infrared absorbing dye, and a free-radical initiator selected from the group consisting of diaryliodonium salt, triarylsulfonium salt, triarylakylborate salt, and tetraarylborate salt.

23. A method of lithographically printing images on a receiving medium, comprising in order:

(a) providing a lithographic plate comprising (i) a hydrophilic substrate; and (ii) an oleophilic thermosensitive layer comprising a free radical polymerizable ethylenically unsaturated monomer having at least one terminal ethylenic group, an infrared absorbing dye, and a free-radical initiator selected from the group consisting of onium salt and borate salt; wherein said thermosensitive layer is capable of hardening upon exposure to an infrared laser radiation, and is soluble or dispersible in ink and on-press developable with ink and fountain solution;

(b) imagewise exposing the plate with the infrared laser radiation according to digital imaging information to cause hardening of the thermosensitive layer in the exposed areas; and (c) contacting said exposed plate with ink and fountain solution on a lithographic press to remove the thermosensitive layer in the non-hardened areas, and to lithographically print images from said plate to the receiving medium.

24. The method of claim 23 wherein said free-radical initiator is an onium salt selected from the group consisting of diazonium salt, iodonium salt, sulfonium salt phosphonium salt, and pyridinium salt.

25. The method of claim 23 wherein said free-radical initiator is a diaryliodonium salt.

26. The method of claim 23 wherein said free-radical initiator is a triarylsulfonium salt.

27. The method of claim 23 wherein said free-radical initiator is a triarylalkylborate salt or tetraarylborate salt.

28. The method of claim 23 wherein said substrate has a roughened surface comprising peaks and valleys, and said thermosensitive layer is substantially conformally coated on the roughened substrate surface so that the surface of said thermosensitive layer has peaks and valleys substantially corresponding to the major peaks and valleys of the substrate microscopic surface; and said substrate has an average surface roughness Ra of about 0.2 to about 2.0 microns, said thermosensitive layer has an average coverage of about 0.1 to about 2.0 $g/m^2$, and the average height of the valleys of the thermosensitive layer surface is at least 0.1 microns below the average height of the peaks of the thermosensitive layer surface.

29. The method of claim 23 wherein said plate further includes a top water soluble or dispersible polymer layer on the thermosensitive layer.

30. The method of claim 23 wherein said plate is mounted on a plate cylinder of said lithographic press for the imagewise infrared laser exposure, on-press development with ink and fountain solution, and lithographic printing.

* * * * *